(12) United States Patent
Ranjan (10) Patent No.: US 9,602,079 B2
(45) Date of Patent: Mar. 21, 2017

(54) TUNABLE ADAPTIVE FILTER WITH VARIABLE GAIN TRANS-CONDUCTANCE STAGE

(75) Inventor: Mahim Ranjan, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 611 days.

(21) Appl. No.: 12/612,608

(22) Filed: Nov. 4, 2009

(65) Prior Publication Data

US 2010/0323651 A1    Dec. 23, 2010

Related U.S. Application Data

(60) Provisional application No. 61/219,730, filed on Jun. 23, 2009.

(51) Int. Cl.
*H04B 1/16* (2006.01)
*H03H 11/12* (2006.01)

(52) U.S. Cl.
CPC ............... *H03H 11/1291* (2013.01)

(58) Field of Classification Search
CPC .... H03G 5/00–5/28; H04B 2001/1054; H04B 2203/5491; H04B 1/1018–1/14; H04B 10/294–10/296; H04B 10/6972; H04B 17/0015
USPC ......... 455/127.2, 241.1, 127.3, 232.1–253.2, 455/307, 339
See application file for complete search history.

(56) References Cited

U.S. PATENT DOCUMENTS

| | | | | |
|---|---|---|---|---|
| 3,792,367 A | * | 2/1974 | Fleischer | H03H 11/0433 327/553 |
| 5,245,646 A | * | 9/1993 | Jackson | H03H 11/1291 327/553 |
| 5,257,286 A | * | 10/1993 | Ray | H04L 25/03019 330/254 |
| 5,940,441 A | * | 8/1999 | Cranford, Jr. | H03H 11/0433 333/18 |
| 5,960,183 A | * | 9/1999 | Toumazou | G06G 7/184 716/100 |
| 6,011,431 A | | 1/2000 | Gilbert | |
| 6,285,231 B1 | | 9/2001 | Opris et al. | |
| 6,377,412 B1 | * | 4/2002 | Freitas | G11B 5/012 360/46 |
| 6,434,620 B1 | | 8/2002 | Boucher et al. | |

(Continued)

FOREIGN PATENT DOCUMENTS

| | | |
|---|---|---|
| CN | 1767381 A | 5/2006 |
| CN | 101401311 A | 4/2009 |

(Continued)

OTHER PUBLICATIONS

International Search Report and Written Opinion—PCT/US2010/039698, International Search Authority—European Patent Office—Mar. 10, 2011.

*Primary Examiner* — Edward Urban
*Assistant Examiner* — Rui Hu
(74) *Attorney, Agent, or Firm* — Rupit M. Patel (57) ABSTRACT

In an exemplary embodiment, the communication device including an analog filter, where a digital signal processor sets the gain of the analog filter and the pole location of the filter simultaneously in order to maintain the filter pole location at a desired value or within a desired range. In further exemplary embodiments, the methodology to simultaneously set the gain and the pole location of the filters.

23 Claims, 6 Drawing Sheets

(56) References Cited

U.S. PATENT DOCUMENTS

| | | | |
|---|---|---|---|
| 7,002,403 B2* | 2/2006 | Marholev | H03H 11/04 327/552 |
| 7,003,271 B2* | 2/2006 | Kluge | H04B 1/30 375/343 |
| 7,065,336 B2* | 6/2006 | Spiegel | H03G 1/04 330/281 |
| 7,139,544 B2* | 11/2006 | Smith | H04B 1/30 330/303 |
| 7,218,170 B1* | 5/2007 | Carter et al. | 327/552 |
| 7,257,178 B2* | 8/2007 | Ichihara | H04B 1/30 330/254 |
| 7,266,361 B2* | 9/2007 | Burdett | H04B 1/30 455/323 |
| 7,701,371 B2 | 4/2010 | Krishnamoorthi et al. | |
| 8,044,718 B2* | 10/2011 | Nicollini | H03G 1/0088 330/254 |
| 8,463,219 B2* | 6/2013 | Kavadias | H03J 3/06 455/260 |
| 2001/0020865 A1* | 9/2001 | Morie | H03F 3/45995 327/552 |
| 2002/0158686 A1 | 10/2002 | Kimura | |
| 2002/0164029 A1 | 11/2002 | Jiang | |
| 2003/0017815 A1* | 1/2003 | Spiegel | H03G 1/04 455/234.1 |
| 2003/0125000 A1* | 7/2003 | Gharpurey | H03G 3/3052 455/234.1 |
| 2003/0203727 A1* | 10/2003 | Kluge | H04B 1/30 455/234.1 |
| 2003/0207679 A1* | 11/2003 | Kaczynski | H03H 11/0433 455/339 |
| 2004/0198287 A1 | 10/2004 | Kramer | |
| 2005/0070325 A1* | 3/2005 | Bellaouar | H04B 1/30 455/550.1 |
| 2005/0162194 A1* | 7/2005 | Kim | H03K 5/2481 327/65 |
| 2006/0006931 A1 | 1/2006 | Hsieh et al. | |
| 2006/0103469 A1* | 5/2006 | Chandra | H03F 1/34 330/303 |
| 2006/0234668 A1* | 10/2006 | Uchitomi | H04L 27/3818 455/333 |
| 2007/0092038 A1* | 4/2007 | Li | H03H 11/1291 375/322 |
| 2007/0232253 A1* | 10/2007 | Li | H03G 9/12 455/333 |
| 2007/0255802 A1 | 11/2007 | Aloni et al. | |
| 2007/0290737 A1 | 12/2007 | Li | |
| 2008/0036634 A1* | 2/2008 | Marais | 341/144 |
| 2008/0100373 A1 | 5/2008 | Terryn et al. | |
| 2008/0160946 A1* | 7/2008 | Lu | H04B 1/28 455/234.2 |
| 2009/0137220 A1* | 5/2009 | Kim | H03F 3/45475 455/234.1 |
| 2009/0212867 A1* | 8/2009 | Fukuzawa | H03G 5/24 330/284 |
| 2011/0051782 A1* | 3/2011 | Gupta | H03H 11/12 375/140 |

FOREIGN PATENT DOCUMENTS

| | | |
|---|---|---|
| CN | 101425792 A | 5/2009 |
| EP | 0912015 A2 | 4/1999 |
| EP | 1406424 A2 | 4/2004 |
| KR | 20090054166 A | 5/2009 |
| WO | 2007115327 A2 | 10/2007 |

* cited by examiner

TUNABLE ADAPTIVE FILTER WITH VARIABLE GAIN TRANS-CONDUCTANCE STAGE

CLAIM OF PRIORITY UNDER 35 U.S.C. §119

The present application for patent claims priority to Provisional Application No. 61/219,730, entitled "TUNABLE ADAPTIVE FILTER WITH VARIABLE GAIN TRANS-CONDUCTANCE STAGE" filed Jun. 23, 2009, and assigned to the assignee hereof and hereby expressly incorporated by reference herein.

TECHNICAL FIELD

The present disclosure relates generally to electronics, and more specifically to a communication device including analog filters.

BACKGROUND

Communication systems are known to support wireless and wire lined communications between wireless and/or wire lined communication devices. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. To participate in wireless communications, each wireless communication device includes a built-in radio transceiver (i.e., receiver and transmitter) or is coupled to an associated radio transceiver (e.g., a station for in-home and/or in-building wireless communication networks, RF modem, etc.).

As is well known, the receiver is coupled to the antenna and includes a low noise amplifier, one or more intermediate frequency stages, a filtering stage, and a data recovery stage. The low noise amplifier receives inbound RF signals via the antenna and amplifies them. The one or more intermediate frequency stages mix the amplified RF signals with one or more local oscillations to convert the amplified RF signals into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The baseband digital signals are converted to analog baseband signals or intermediate (IF) signals. The transmitter filtering stage filters the baseband or the IF signals to remove images caused by the data digital signal processing and the digital to analog conversion process.

The transmitter filtering stage further processes the baseband analog or intermediate analog signals in accordance with the particular communication standard. The one or more intermediate frequency stages mix the baseband signals with one or more local oscillations to produce RF signals. The power amplifier amplifies the RF signals prior to transmission via an antenna.

To aid the reception and transmission analog signal processing various types of analog filters can be fully integrated on chip. Such filters can be resistor-capacitor (RC) filters (passive or active), switch capacitor filters and transconductor-capacitor (Gm-C) filters. An analog RC filter includes resistor-capacitor combinations to set the pole frequency of the filter. It may also include transconductance stages, commonly called gm stages, in various configurations to set the filter gain.

Figure 2:
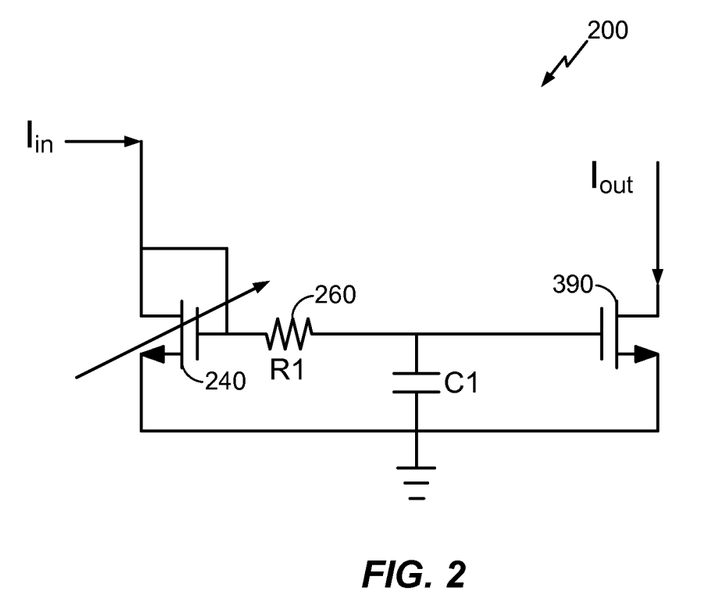
FIG. 2 is a block level diagram of an analog filter.

FIG. 2 is a block level diagram of analog filter 200. It comprises a transconductance stage 240, a resistor-capacitor R1-C1 combination and a transimpedance stage 390. Analog filter 200 is configured as a current mode filter where its input is current Iin and its output is current Iout. Transconductance stage 240 connects to a first terminal of resistor 260. A second terminal of resistor 260 connects to a first terminal of capacitor C1. A second terminal of capacitor C1 connects to ground. The second terminal of resistor 260 connects to transimpedance stage 390. The overall filter transfer function is defined as Iout/Iin.

The 3 dB cutoff frequency, therefore the filter bandwidth, for such a typical filter configuration can be approximately expressed as:

$$F_{-3dB} \approx \frac{1}{\left(R1 + \frac{1}{g_m}\right) \cdot C1} \qquad \text{Eq. (1)}$$

The gain of the filter may be changed by changing the size of the transconductance stage 240.

Modern communication protocols require that both the receiver and the transmitter filtering include gain control. In typical filters employing a transconductance stage, if the gain of the filter is changed by changing the transconductance, the filter pole locations may change resulting in filter bandwidth variations over gain control. However, bandwidth variation in a filter may lead to significant performance degradation in both receive and transmit signal paths of the wireless device. In the receive path, variations in the bandwidth of the receiver's baseband analog filter leads to performance degradation in static sensitivity, sensitivity in the presence of interferers, receiver IP3, and anti-aliasing performance. Alternately, in the transmit path, variations in the transmitter's baseband filter bandwidth leads to performance degradation in the transmitter's EVM (Error Vector Magnitude), ACLR (Adjacent Channel Leakage Ratio), and static/transient power mask performance.

Prior art has shown various implementations for calibrating the filter bandwidth and gain but these implementations tend to require significant calibration time. In mobile communication devices, particularly in transmitters, the gain of the analog filters can change very rapidly with stringent requirements on how much time is allowed between gain steps. Doing a sequential adjustment of the gain of the filter gain, first, and then of the bandwidth of the filter could violate the transmitter timing requirements. Hence, implementing on-chip filters to meet these stringent timing requirements is particularly difficult for multimode-multiprotocol communication systems. Thus, a need exists for on-chip filter structure and operational methodology for meeting these requirements.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
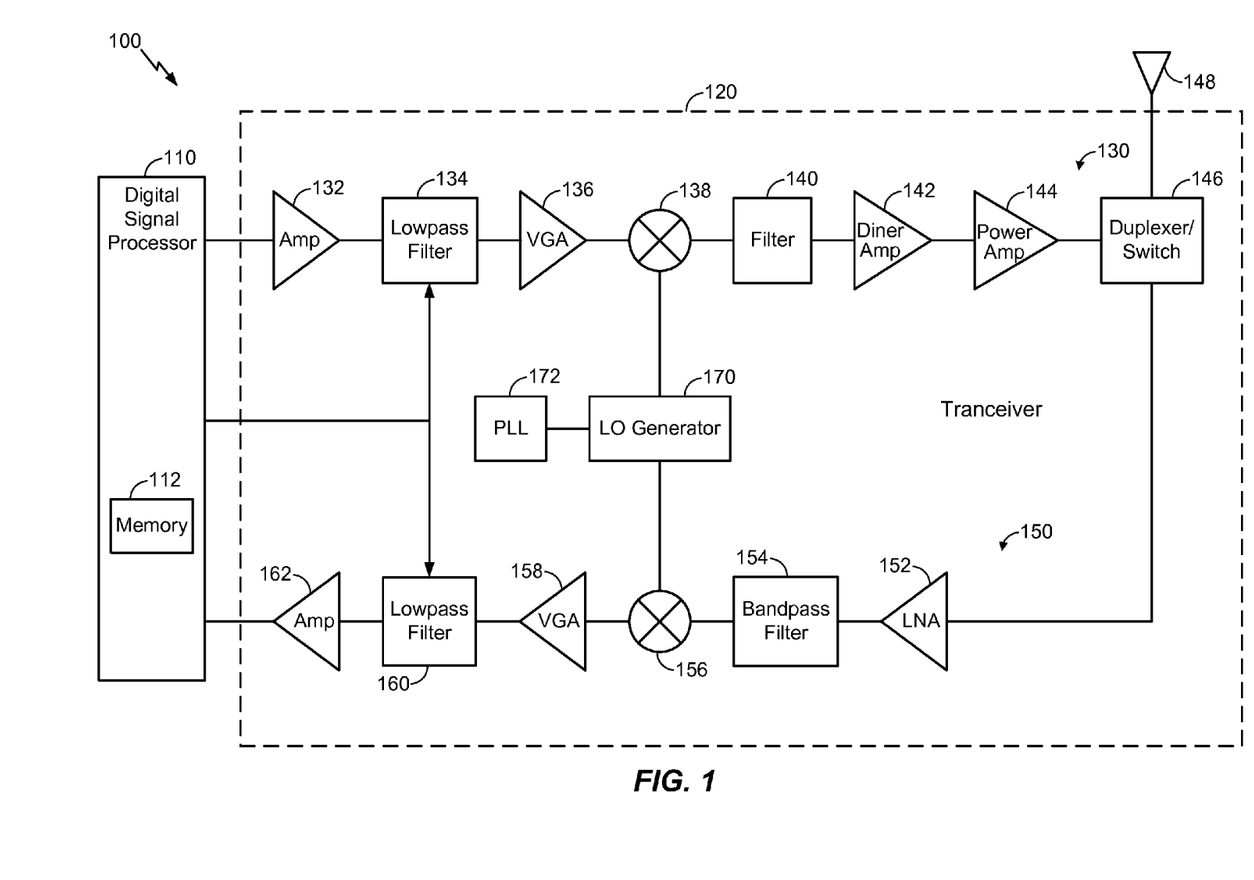
FIG. 1 shows a block diagram of a wireless communication device according to an exemplary embodiment.

FIG. 1 shows a block diagram of wireless communication device 100, according to an exemplary embodiment. In this exemplary design, wireless communication device 100 includes a device 110, such as a digital signal processor (DSP), and a transceiver 120. Transceiver 120 includes a transmitter 130 and a receiver 150 that support bi-directional wireless communication. In general, wireless communication device 100 may include any number of transmitters and any number of receivers for any number of communication systems and any number of frequency bands.

In the transmit path, device 110 processes data to be transmitted and provides an analog output signal to transmitter 130. Within transmitter 130, the analog output signal is first amplified by an amplifier (Amp) 132, then filtered by an analog filter 134, such as a low pass filter, to remove images caused by digital-to-analog conversion (DAC), further amplified by a VGA 136, and then upconverted from baseband to RF by a mixer 138. The upconverted signal is then filtered by a filter 140 to remove images caused by the frequency upconversion, further amplified by a driver amplifier (DA) 142 and a power amplifier (PA) 144, then routed through a duplexer/switch 146, and finally transmitted via an antenna 148.

In the receive path, antenna 148 receives signals from base stations and provides a received signal, which is routed through duplexer/switch 146 and provided to receiver 150. Within receiver 150, the received signal is amplified by an LNA 152, filtered by a band pass filter 154, and downconverted from RF to baseband by a mixer 156. The downconverted signal is amplified by a VGA 158, filtered by an analog filter 160, such as a low pass filter, and amplified by an amplifier 162 to obtain an analog input signal, which is provided to DSP 110.

As shown in FIG. 1, transmitter 130 and receiver 150 implement a direct-conversion architecture, that frequency converts a signal between RF and baseband in one stage. Transmitter 130 and/or receiver 150 may also implement a super-heterodyne architecture, which frequency converts a signal between RF and baseband in multiple stages. A local oscillator (LO) generator 170 generates and provides transmit and receive LO signals to mixers 138 and 156, respectively. A phase locked loop (PLL) 172 receives control information from data processor 110 and provides control signals to LO generator 170 to generate the transmit and receive LO signals at the proper frequencies.

In general, the conditioning of the signals in transmitter 130 and receiver 150 may be performed by one or more stages of amplifier, filter, mixer, etc. These circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. All or a portion of transceiver 120 may be implemented on an analog integrated circuit (IC), an RF IC (RFIC), a mixed-signal IC, etc. For example, amplifier 132 through driver amplifier 142 in transmitter 130 may be implemented on an RFIC whereas power amplifier 144 may be implemented external to the RFIC.

Device 110 may perform various functions for wireless device 100, e.g., digital processing for transmitted and received data. A memory 112 may store program codes and data for device 110. Device 110 may be implemented on one or more application specific integrated circuits (ASICs) and/or other ICs.

As shown in FIG. 1, a transmitter and a receiver may include various filters. Each filter may be implemented in various manners.

Figure 3:
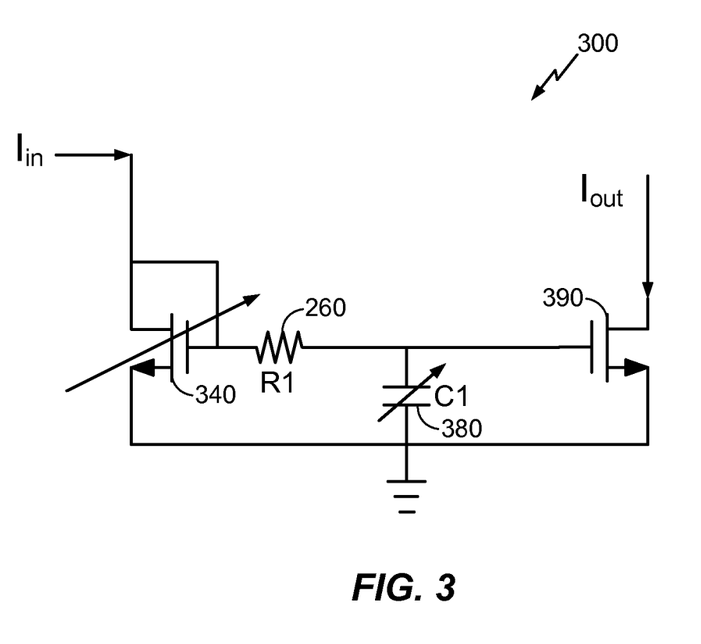
FIG. 3 is a block level diagram of a filter circuit in accordance with an exemplary embodiment.

FIG. 3 is block level diagram of filter circuit 300 in accordance to an exemplary embodiment. It comprises input transconductance stage 340, resistor-capacitor combination 360-380 and output transimpedance stage 390. Input transconductance stage 340 is a variable transconductance in order to set the gain of the filter. Capacitor 380 is a variable capacitor. In one embodiment, as it will be discussed later and shown in FIG. 4, the variable capacitor may employ a bank of switched capacitors. Filter 300 is configured as a current mode filter where its input is current Iin and its output is current Iout. Input transconductance stage 340 connects to a first terminal of resistor 360. A second terminal of resistor 360 connects to a first terminal of capacitor 380. A second terminal of capacitor 380 connects to ground. The second terminal of resistor 360 connects to the output transimpedance stage 390.

When the transconductance gm of the input transconductor stage 340 is reduced, the capacitance of the capacitor 380 is reduced to maintain pole location in accordance with Equation 1, and vice versa when the transconductance gm of the input transconductor stage 340 is increased.

In the exemplary embodiment of FIG. 3, the gain of the filter changes by changing the size of input transconductance stage 340. Alternatively, the gain can be changed by changing the size of the output transimpedance stage 390. One of skill can appreciate that both implementations of transmitter gain control may be used in a transmitter to facilitate the requirements on gain range and granularity.

One of skill in the art can appreciate that a variable resistor, or like component, or like combination of components, may be used to set or adjust the pole location of the analog filter.

Using either of these implementations results in a different mapping of capacitor size over gain setting since each gain control method has a different impact on the pole frequency.

A digital signal processor can be employed to simultaneously adjust gain and pole locations based on gain, as opposed to sequentially setting the gain and the pole frequency. Therefore allowing the gain of the analog filter to change very rapidly and meet stringent timing requirements between gain steps.

Figure 4:
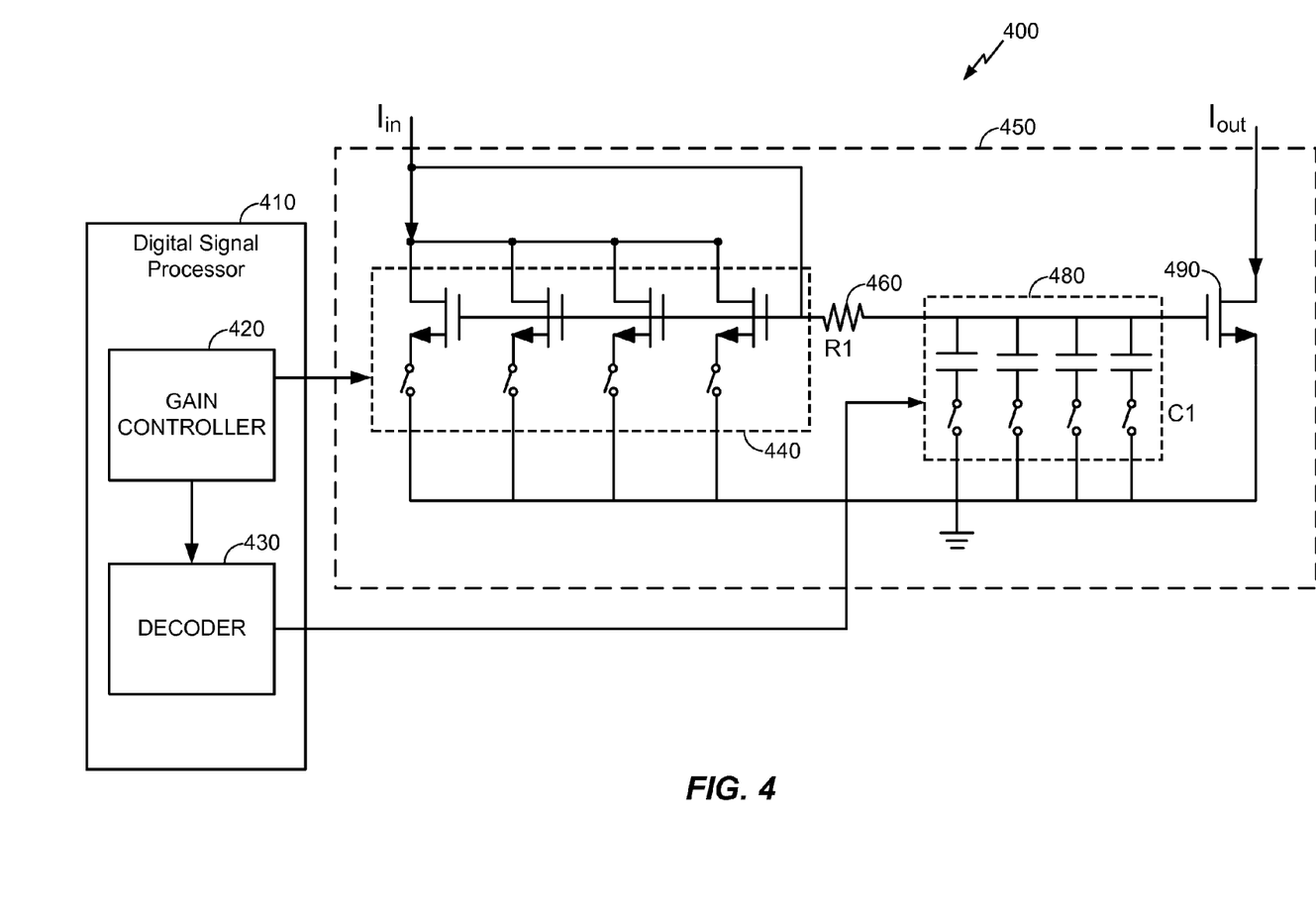
FIG. 4 shows an exemplary embodiment where the gain and pole tuning of the filter are set simultaneously.

FIG. 4 shows an exemplary embodiment where the gain and pole tuning are set simultaneously. Wireless communication device 400 comprises a device 410, such as a DSP, and analog filter 450. Device 410 comprises gain controller 420 and decoder 430. Filter 450 comprises variable transconductance stage 440, resistor-capacitor 460-480 combination and transimpedance stage 490. In the embodiment of FIG. 4, the variable transconductance stage comprises a bank of MOS devices connected in parallel in order to set the gain of the analog filter. In the embodiment of FIG. 4, the variable capacitor employees a bank of switched capacitors 480. Variable transconductance stage 440 connects to a first terminal of resistor 460. A second terminal of resistor 460 connects to a first terminal of capacitor 480. A second terminal of variable capacitor 480 connects to ground. The second terminal of resistor 460 connects to transimpedance stage 490.

Gain controller 420 directly controls the size and therefore the gain of the variable transconductance stage 440. In an alternate embodiment, not shown, it may additionally control the size and therefore the gain of transimpedance stage 490. Gain controller 420 couples to decoder 430. Decoder 430 couples to variable capacitor 480. In response to a gain decision, decoder 430 maps appropriately the required gain of the analog filter to the corresponding capacitance so the filter pole location remains at a desired value or within a desired range. Thus, in the exemplary embodiment of FIG. 4, gain and pole location of the analog filter are set simultaneously.

Figure 5:
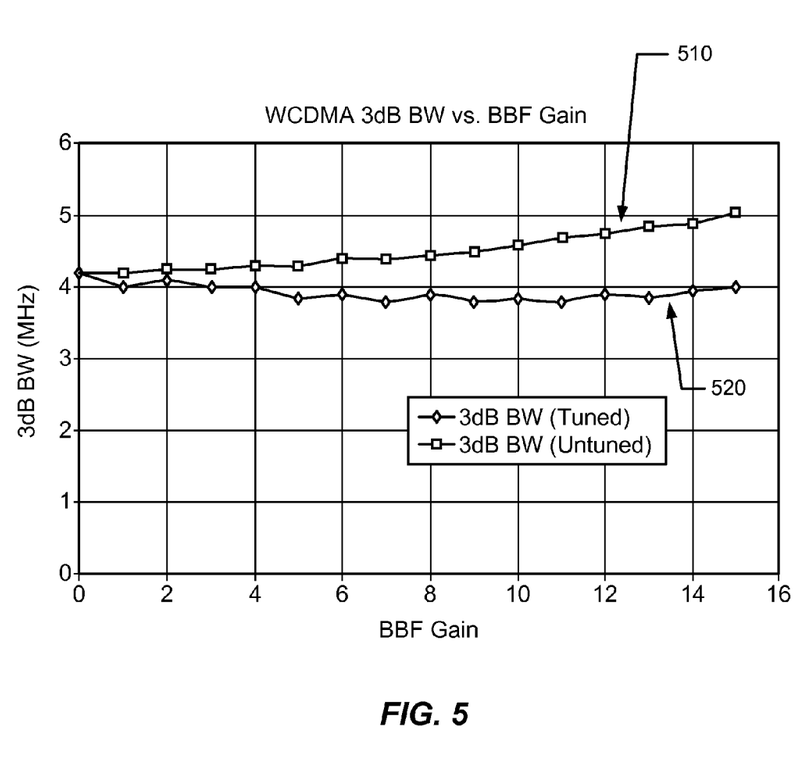
FIG. 5 illustrates an exemplary measurement data of a silicon implementation.

FIG. 5 illustrates an exemplary measurement data of a silicon implementation. FIG. 5 shows the measured 3 dB frequency over gain of an analog filter in accordance with an exemplary embodiment. Curve 520 shows that 3 dB frequency over gain of the analog filter remains within a specific range when the tuning scheme is enabled. When the tuning scheme is disabled then the 3 dB frequency of the filter significantly varies when gain changes, as shown by curve 510 of FIG. 5.

Figure 6:
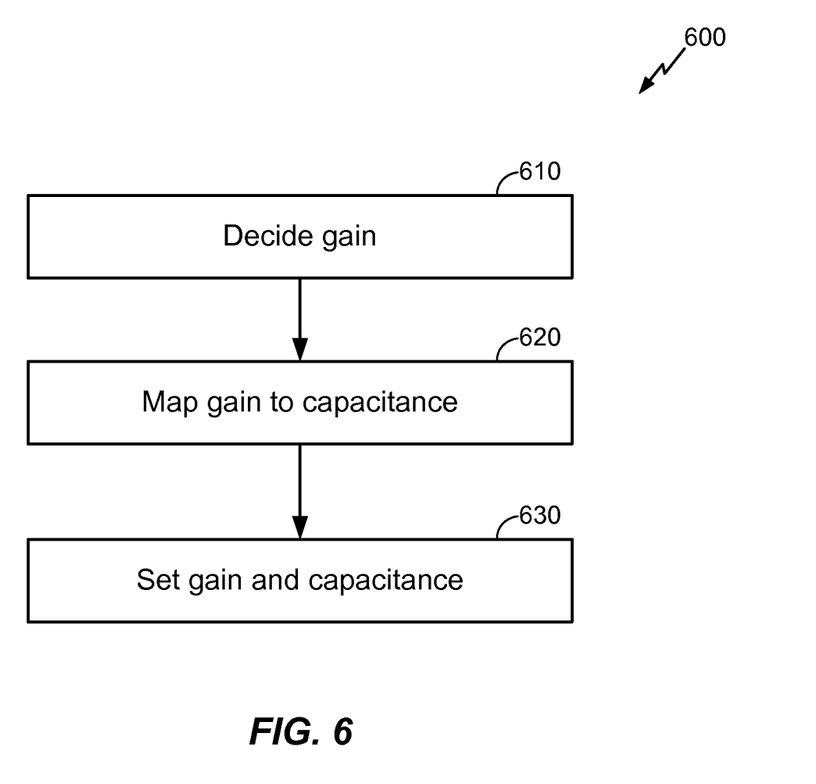
FIG. 6 shows a flow process for setting gain and pole frequency simultaneously.

FIG. 6 shows a flow chart of a method for setting gain and pole location simultaneously, according to another exemplary embodiment. In this embodiment, in step 610, a gain controller generates a gain decision. In step 620, a decoder maps appropriately the decided gain of the analog filter to a corresponding capacitance so the analog filter pole location remains at a specific value or within a specific range. In last step 630, the gain controller and the decoder set simultaneously the gain of the variable transconductance stage and the capacitance of the variable capacitor, respectively.

It can be anticipated that a person skilled in the art can find various configurations of implementing the gain controller and the decoder without departing from the scope of the invention. Equally, various mapping techniques can be used to determine, compute or otherwise specify the capacitance corresponding to gain, so that the filter pole location remains at a desired value or within a desired range.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The invention claimed is:

1. A device including a baseband processor for setting transconductance $g_m$ and pole frequency parameters in an analog filter, comprising:
   a gain controller configured to generate, on the basis of a determination of a desired change in gain, a gain control signal to adjust the transconductance $g_m$ parameter; and
   a decoder configured to generate, on the basis of the determination and the gain control signal, a pole frequency control signal mapped from the gain control signal that simultaneously adjusts the pole frequency to maintain at a specific value a bandwidth of the analog filter across a range of changes to the gain of the analog filter, wherein the gain control signal is configured to selectively switch on a subset of parallel-arranged transconductors, and the pole frequency control signal is configured to selectively switch on a subset of parallel-arranged capacitor elements.

2. The device of claim 1, wherein the decoder includes means for generating the pole frequency control signal from a precalculated value stored in memory for the associated desired change in gain.

3. The device of claim 1, wherein the pole frequency control signal is derived in accordance with the following formula:

$$F_{-3dB} \approx \frac{1}{\left(R1 + \frac{1}{g_m}\right) \cdot C1}$$

where $F_{-3dB}$ is filter bandwidth and R1 and C1 are the resistance and capacitance, respectively, of an RC circuit in the analog filter.

4. The device of claim 1, wherein the analog filter is a current mode analog filter.

5. The device of claim 4, wherein the current mode analog filter is a MOS device.

6. The device of claim 5, wherein the current mode analog filter is part of an RF transmit and receive circuit.

7. The device of claim 6, wherein the device includes the RF transmit and receive circuit.

8. A method of setting transconductance $g_m$ and pole frequency parameters in an analog filter, comprising:
   generating, on the basis of a determination of a desired change in gain, a gain control signal to adjust the transconductance $g_m$ parameter; and
   generating, on the basis of the determination and the gain control signal, a pole frequency control signal mapped from the gain control signal that simultaneously adjusts the pole frequency to maintain at a specific value a bandwidth of the analog filter across a range of changes to the gain of the analog filter, wherein the gain control signal is configured to selectively switch on a subset of parallel-arranged transconductors, and the pole frequency control signal is configured to selectively switch on a subset of parallel-arranged capacitor elements.

9. The method of claim 8, wherein the generating the pole frequency control signal involve retrieving a precalculated value stored in memory for the associated desired change in gain.

10. The method of claim 8, wherein the pole frequency control signal is derived in accordance with the following formula:

$$F_{-3dB} \approx \frac{1}{\left(R1 + \frac{1}{g_m}\right) \cdot C1}$$

where $F_{-3dB}$ is filter bandwidth and R1 and C1 are the resistance and capacitance, respectively, of an RC circuit in the current mode analog filter.

11. The method of claim 8, wherein the analog filter is a current mode analog filter.

12. The method of claim 11, wherein the current mode analog filter is a MOS device.

13. The method of claim 12, wherein the current mode analog filter is part of an RF transmit and receive circuit.

14. The method of claim 13, wherein the RF transmit and receive circuit is part of a wireless communication device.

15. A digital signal processing device for setting transconductance $g_m$ and pole frequency parameters in a current mode analog filter, comprising:
   means for generating, on the basis of a determination of a desired change in gain, a gain control signal to adjust the transconductance $g_m$ parameter; and
   means for generating, on the basis of the determination and the gain control signal, a pole frequency control signal mapped from the gain control signal that simultaneously adjusts the pole frequency to maintain at a specific value a bandwidth of the analog filter across a range of changes to the gain of the analog filter, wherein the gain control signal is configured to selectively switch on a subset of parallel-arranged transconductors, and the pole frequency control signal is configured to selectively switch on a subset of parallel-arranged capacitor elements.

16. The device of claim 15, wherein the means for generating the pole frequency control signal include means for retrieving a precalculated value stored in memory for the associated desired change in gain.

17. The device of claim 15, wherein the pole frequency control signal is derived in accordance with the following formula:

$$F_{-3dB} \approx \frac{1}{\left(R1 + \frac{1}{g_m}\right) \cdot C1}$$

where $F_{-3dB}$ is filter bandwidth and R1 and C1 are the resistance and capacitance, respectively, of an RC circuit in the analog filter.

18. A non-transitory computer program product having instructions for causing a digital signal processing device coupled to a current mode analog filter with selectively settable transconductance $g_m$ and pole frequency parameters to:
generate, on the basis of a determination of a desired change in gain, a gain control signal to adjust the transconductance $g_m$ parameter; and
generate, on the basis of the determination and the gain control signal, a pole frequency control signal mapped from the gain control signal that simultaneously adjusts the pole frequency to maintain at a specific value a bandwidth of the analog filter across a range of changes to the gain of the analog filter, wherein the gain control signal is configured to selectively switch on a subset of parallel-arranged transconductors, and the pole frequency control signal is configured to selectively switch on a subset of parallel-arranged capacitor elements.

19. The non-transitory computer program product of claim 18, wherein the pole frequency control signal is derived in accordance with the following formula:

$$F_{-3dB} \approx \frac{1}{\left(R1 + \frac{1}{g_m}\right) \cdot C1}$$

where $F_{-3dB}$ is filter bandwidth and R1 and C1 are the resistance and capacitance, respectively, of an RC circuit in the analog filter.

20. An RF transmit and receive device including a current mode analog filter comprising:
a transconductance input stage and a transimpedance stage responsive to a gain control signal to adjust at least one of a transconductance $g_m$ parameter and a transimpedance parameter in the current mode analog filter; and
an RC circuit responsive to a pole frequency control signal to set a pole frequency parameter, wherein the gain control signal is generated on the basis of a determination of a desired change in gain of the current mode analog filter, while the pole frequency control signal mapped from the gain control signal is generated to simultaneously adjust the pole frequency parameter to maintain at a specific value a bandwidth of the analog filter across a range of changes to the gain of the analog filter, wherein the gain control signal is configured to selectively switch on a subset of parallel-arranged transconductors, and the pole frequency control signal is configured to selectively switch on a subset of parallel-arranged capacitor elements.

21. The device of claim 20, wherein the pole frequency control signal is derived in accordance with the following formula:

$$F_{-3dB} \approx \frac{1}{\left(R1 + \frac{1}{g_m}\right) \cdot C1}$$

where $F_{-3dB}$ is filter bandwidth and R1 and C1 are the resistance and capacitance, respectively, of the RC circuit.

22. The device of claim 20, wherein the analog filter is a current mode analog filter.

23. The device of claim 22, wherein the current mode analog filter is a MOS device.

* * * * *